US007259513B2

(12) United States Patent
Suh et al.

(10) Patent No.: US 7,259,513 B2
(45) Date of Patent: Aug. 21, 2007

(54) ELECTROLUMINESCENT DISPLAY DEVICE HAVING SURFACE TREATED ORGANIC LAYER AND METHOD OF FABRICATING THE SAME

(75) Inventors: Min-Chul Suh, Seongnam-si (KR); Nam-Choul Yang, Seoul (KR); Seong-Taek Lee, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 133 days.

(21) Appl. No.: 10/992,201

(22) Filed: Nov. 19, 2004

(65) Prior Publication Data

US 2005/0184653 A1    Aug. 25, 2005

(30) Foreign Application Priority Data

Feb. 20, 2004    (KR)    ............ 10-2004-0011572

(51) Int. Cl.
*H01J 63/04*    (2006.01)
*H01J 1/62*    (2006.01)
*H05B 33/00*    (2006.01)

(52) U.S. Cl. .............. 313/504; 313/503; 313/506; 428/690; 428/917

(58) Field of Classification Search ........ 313/503–504, 313/506
See application file for complete search history.

(56) References Cited

U.S. PATENT DOCUMENTS

| 5,220,348 | A | 6/1993 | D'Aurelio | 347/236 |
|---|---|---|---|---|
| 5,256,506 | A | 10/1993 | Ellis et al. | 430/20 |
| 5,278,023 | A | 1/1994 | Bills et al. | 430/201 |
| 5,308,737 | A | 5/1994 | Bills et al. | 430/201 |
| 5,668,551 | A | 9/1997 | Garavan et al. | 341/120 |
| 5,937,272 | A | 8/1999 | Tang | 438/30 |
| 5,998,085 | A | 12/1999 | Isberg et al. | 430/200 |
| 6,114,088 | A | 9/2000 | Wolk et al. | 430/273.1 |
| 6,214,520 | B1 | 4/2001 | Wolk et al. | 430/273.1 |
| 6,379,743 | B1* | 4/2002 | Lee et al. | 427/66 |
| 6,433,487 | B1* | 8/2002 | Yamazaki | 313/506 |
| 6,614,174 | B1* | 9/2003 | Urabe et al. | 313/504 |
| 6,954,031 | B2* | 10/2005 | Hashimoto et al. | 313/503 |
| 7,101,630 | B2* | 9/2006 | Kato | 313/504 |
| 2001/0005528 | A1* | 6/2001 | Lee et al. | 427/66 |
| 2004/0144976 | A1* | 7/2004 | Dahmani et al. | 257/40 |
| 2006/0158100 | A1* | 7/2006 | Morii et al. | 313/503 |

FOREIGN PATENT DOCUMENTS

| JP | 08-185983 | 7/1996 |
|---|---|---|
| KR | 2000-0034508 | 6/2000 |

* cited by examiner

*Primary Examiner*—Sikha Roy
*Assistant Examiner*—Natalie K. Walford
(74) *Attorney, Agent, or Firm*—H.C. Park & Associates, PLC

(57) ABSTRACT

An organic electroluminescent display device includes a substrate, a first electrode formed on the substrate, an organic layer formed on the first electrode, and a second electrode formed on the organic layer. The organic layer includes an organic emission layer and an organic material layer, and the organic material layer has a surface with a roughness in a range of Rms 11 Å to 50 Å.

8 Claims, 3 Drawing Sheets

ELECTROLUMINESCENT DISPLAY DEVICE HAVING SURFACE TREATED ORGANIC LAYER AND METHOD OF FABRICATING THE SAME

CROSS-REFERENCE TO RELATED APPLICATION

This application claims priority to and the benefit of Korean Patent Application No. 10-2004-0011572, filed on Feb. 20, 2004, which is hereby incorporated by reference for all purposes as if fully set forth herein.

BACKGROUND OF THE INVENTION

1. Field of the Invention

The present invention relates to an organic electroluminescent (EL) display device and, more particularly, to an organic EL display device in which organic layers have improved adhesion to each other.

2. Discussion of the Related Art

Generally, an organic EL device includes an anode, a cathode, and an organic layer. The organic layer may be comprised of various layers, including a hole injection layer, a hole transport layer, an emission layer, an electron transport layer, and an electron injection layer. The organic EL device may be classified as a polymer type and a small-molecule type according to materials used in the organic layer. For the small-molecule organic EL device, each layer may be formed by a vacuum deposition method, and for the polymer organic EL device, the layers may be made by a spin coating process.

Single color organic EL devices using polymer may be simply fabricated by the spin coating process. Although the polymer organic EL device has a lower driving voltage than the small-molecule device, it is less efficient, and it has a shorter lifetime. Further, patterning red, green and blue polymers for a full-color display device by inkjet technology or a laser induced thermal imaging (LITI) method may degrade emission characteristics such as efficiency and lifespan.

When the patterning by the LITI method, single polymer materials may not transfer. Korean Patent Application No. 1998-51844 and U.S. Pat. Nos. 5,998,085, 6,214,520 and 6,114,088 disclose a method of forming the pattern of the polymer organic EL device by the LITI method.

The LITI method may utilize a light source, a transfer film and a substrate. A light absorption layer of the transfer film absorbs emitted light from the light source and converts it into thermal energy. Material forming a transfer layer of the transfer film is then transferred onto the substrate by the thermal energy to form a desired image (U.S. Pat. Nos. 5,220,348, 5,256,506, 5,278,023 and 5,308,737).

As disclosed in U.S. Pat. No. 5,998,085, the LITI method may be used to fabricate a color filter of a liquid crystal display device, and it may also be used to form a pattern of emission material. This method may transfer the material without transferring heat, unlike the LITI method using sublimation of the material.

U.S. Pat. No. 5,937,272 discloses a method of forming high definition patterned organic layers in a full-color organic EL device, wherein a donor support coated with a coating material is heated to transfer the organic EL material onto a designated recessed surface of a substrate in a designated sub-pixel. Heat or light may vaporize the emission material, which transfers it onto the pixel.

Similarly, in U.S. Pat. No. 5,688,551, a transfer from a donor sheet to a receiver sheet may be used to form a sub-pixel in a pixel region. An organic EL material with sublimation properties may be transferred from the donor sheet to the receiver sheet at a low temperature (less than 400° C.) to form the sub-pixel.

FIG. 1 is a cross-sectional view showing a typical structure of a conventional full-color organic EL device.

Referring to FIG. 1, a first electrode 110 is patterned and formed on an insulating substrate 100. The first electrode 110 may be transparent for a bottom emission structure, and it may be a reflective for a top emission structure.

A pixel defining layer (PDL) 120 may be formed of an insulating material on the first electrode 110 and the substrate 100 to define a pixel region and to insulate between emission layers.

An organic layer 300 having an organic emission layer 150 may be formed in the pixel region defined by the PDL 120. The organic layer 300 may further include a hole injection layer 130, a hole transport layer 140, a hole blocking layer 160, an electron transport layer 170 and an electron injection layer 180, as well as the above organic emission layer. Both polymer and small-molecule materials may be used as the organic emission layer 150.

A second electrode 190 may be formed on the organic layer 300. The second electrode 190 may be reflective when the first electrode 110 is transparent, and it may be transparent when the first electrode 110 is reflective. Encapsulating the organic EL device completes its fabrication.

However, when an organic layer having a conventional organic emission layer is formed by the LITI method, adhesion between a transfer layer material to be transferred from a donor film and an organic material formed on the substrate may not be sufficient. If the materials do not adhere appropriately, particles may be generated by breakage and exfoliation of the organic layer, and the organic layer may crack.

SUMMARY OF THE INVENTION

The present invention provides an organic EL display device and method for fabricating the same in which adhesion between organic layers is improved by treating a surface of the organic layers, thereby improving the device's lifespan and mitigating failures that may be generated by exfoliation of the organic layer due to poor contact between the organic layers.

Additional features of the invention will be set forth in the description which follows, and in part will be apparent from the description, or may be learned by practice of the invention.

The present invention discloses an organic electroluminescent display device including a first electrode formed on a substrate, an organic layer formed on the first electrode, and a second electrode formed on the organic layer. The organic layer comprises an organic emission layer and a second layer, and the second layer has a surface with a roughness in a range of Rms 11 Å to 50 Å.

The present invention also discloses a method for fabricating an organic electroluminescent display device including forming a first electrode on a substrate, depositing an organic layer made of an organic emission layer and a first organic material layer on the first electrode, and forming a second electrode on the organic layer. Depositing the organic layer includes depositing the first organic material layer and then oxygen plasma processing an upper surface of the first organic material layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
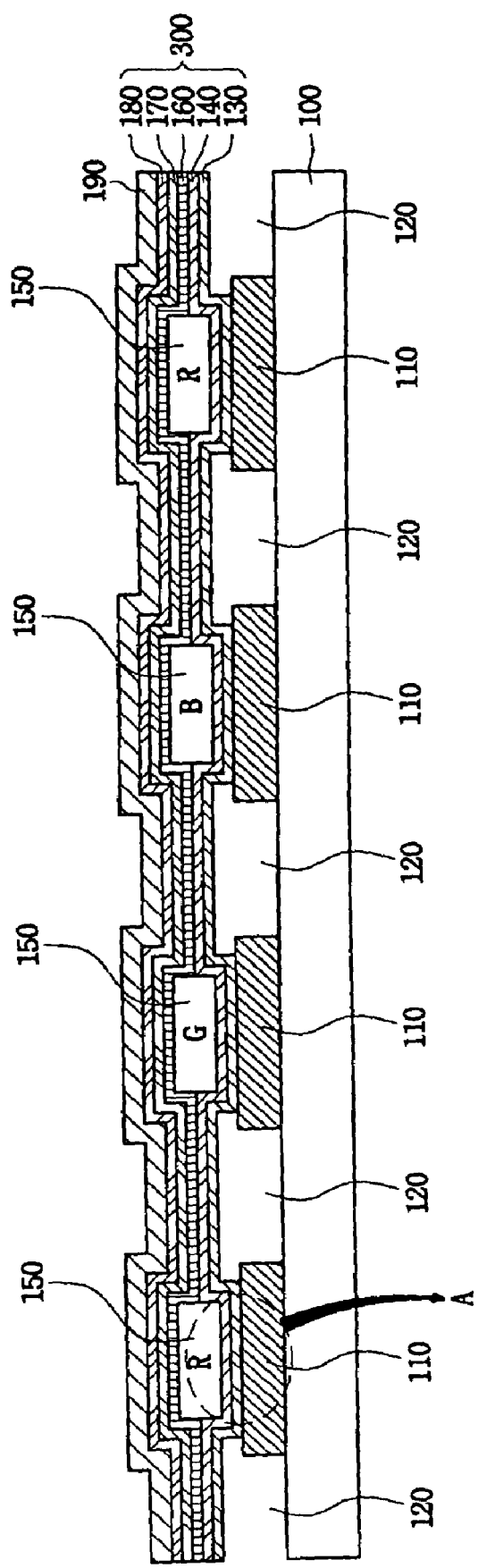
FIG. 1 is a cross-sectional view showing a typical structure of a conventional full-color organic EL device.

The present invention will now be described more fully hereinafter with reference to the accompanying drawings, which show exemplary embodiments of the invention. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
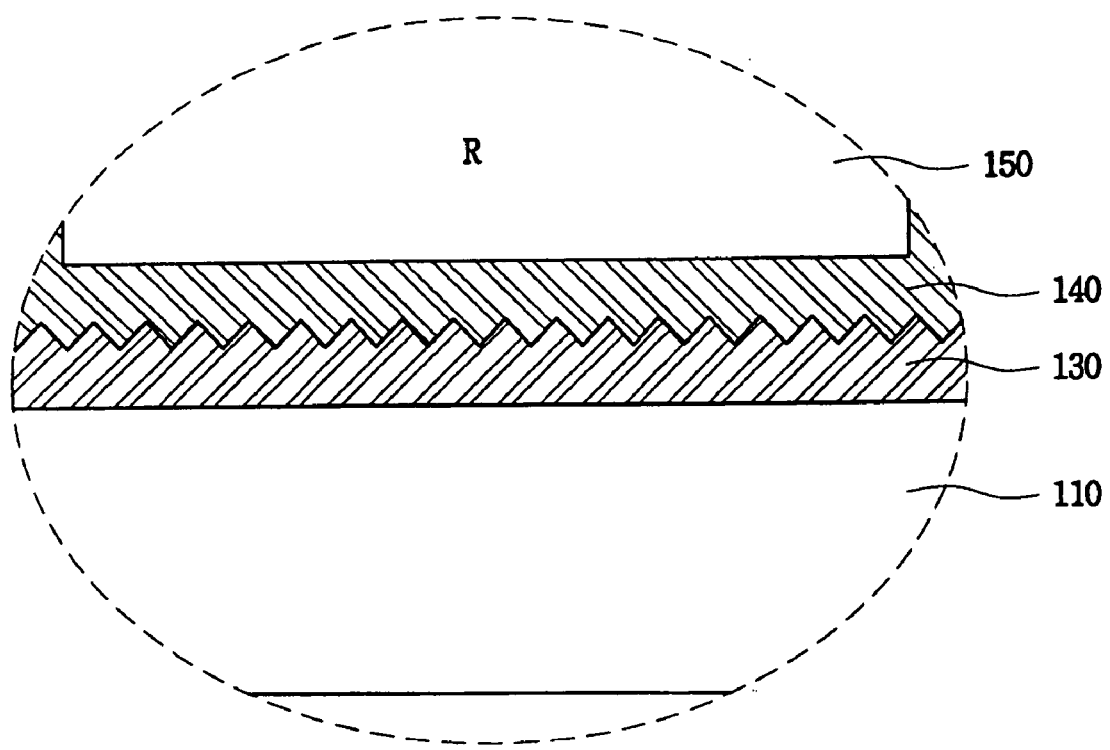
FIG. 2 is an enlarged cross-sectional view showing the portion A of FIG. 1 in accordance with an exemplary embodiment of the present invention.

FIG. 2 is an enlarged cross-sectional view of the portion A of FIG. 1 showing an exemplary embodiment of the present invention.

Referring to FIG. 1 and FIG. 2, an organic EL display device of the present invention includes a substrate 100, a first electrode 110 formed on the substrate 100, an organic layer 300 formed on the first electrode 110, and a second electrode 190 formed on the organic layer 300.

The organic layer 300 includes the organic emission layer 150 and at least one organic material layer. The organic material layer may be a hole injection layer 130, a hole transport layer 140, a hole blocking layer 160, an electron transport layer 170, or an electron injection layer 180.

According to an exemplary embodiment of the present invention, as shown in FIG. 2, when the first electrode 110 is an anode electrode, the hole injection layer 130 and the hole transport layer 140 may be interposed between it and the organic emission layer 150.

When the hole transport layer 140 is to be formed by a deposition method, the upper surface of the hole injection layer 130 may be treated to make it rougher in order to enhance the adhesion between the hole injection layer 130 and the hole transport layer 140.

Also, treating the surface of the hole transport layer 140 that contacts the hole injection layer 130 may further increase the adhesion between the two layers.

Therefore, surface roughness may increase by treating the upper surface of the lower hole injection layer 130, by treating the lower surface of the hole transport layer 140, or by treating both surfaces.

The surface roughness may be in a range of Rms 11 Å to 50 Å, which may be measured with an atomic force microscope (AFM). When it is less than 11 Å, adhesion with the donor film may not be improved enough to prevent a problem that the film adheres to the substrate in laminating the film, and when it is more than 50 Å, the transferred material may not have a uniform shape, which may degrade the efficiency and lifetime of the characteristics of the display device.

Although surfaces of the hole injection layer 130 and the hole transport layer 140 were described above, all contacting surfaces between two organic material layers constituting the organic layer 300 may be treated, thus improving the adhesion between the treated organic material layers.

Here, the upper layer may be formed by a typical deposition method, however, when the LITI method is used, the surface roughness should be within Rms 11 Å to 50 Å so that the adhesion between the material to be transferred and the organic material formed on the substrate may permit good transfer characteristics.

Among the organic material layers, the layer whose surface roughness is Rms 11 Å to 50 Å may be formed of either a small-molecule or a polymer when it is an organic material.

However, when the organic material layer is formed of the polymer, the surface may have a lower surface roughness than the small-molecule, so that the polymer surface may need to be treated to increase its roughness.

Therefore, any organic material may be used as the organic material for the present invention provided it is typically used for each layer.

Further, fluorescent material, phosphorescent material, or other like material may be used for the organic emission layer 150.

When the first electrode 110 is a cathode electrode, the second electrode 190 is formed as an anode electrode, so that the organic layer 300 has an inverted structure of the above-described one.

The organic EL display device of the present invention may include at least one thin film transistor, and it may be applied to both a bottom and top emission organic EL display device.

A method of fabricating an organic EL display device of an exemplary embodiment of the present invention will now be described.

Referring to FIG. 1 and FIG. 2, a first electrode 110 may be patterned and formed on a substrate 100 by a typical method such as sputtering.

Next, an organic layer 300, made of an organic emission layer 150 and a hole injection layer 130, a hole transport layer 140; a hole blocking layer 160, an electron transport layer 170, or an electron injection layer 180, is sequentially deposited on the first electrode 110.

According to an exemplary embodiment of the present invention, the PDL 120 may be formed after forming the first electrode 110, and the hole injection layer 130 may then be formed thereon.

Subsequently, the surface of the hole injection layer 130 may be treated with oxygen plasma or other like treatments.

Here, the oxygen plasma process is preferably performed under conditions of a pressure in a range of 10 mT to 1700 mT, a power of more than 1000 W, more preferably a source power of 2000 W, a bias power of 500 W, and an $O_2$ flux in a range of 100 sccm to 700 sccm for 10 seconds.

Preferably, the hole injection layer 130 is treated so that its surface roughness is in a range of Rms 11 Å to 50 Å.

The hole transport layer 140 may then be deposited on the hole injection layer 130. Here, the hole transport layer 140 may be deposited by a typical deposition method such as a chemical vapor deposition method, a liquid phase deposition method, a LITI method, or other like method.

When deposited by the LITI method, it is preferable to treat the lower surface of the hole transport layer 140 with oxygen plasma before transferring the layer onto the substrate.

Here, the conditions under which the hole transport layer 140 is oxygen plasma treated are the same as that of the hole injection layer 130 described above, so that the treated surface roughness may be in a range of Rms 11 Å to 50 Å.

Next, the organic emission layer 150 may be patterned and formed on the hole injection layer 140 with red (R), green (G) and blue (B) portions, and the hole blocking layer 160, the electron transport layer 170 and the electron injection layer 180 may then be selectively deposited. A second electrode 190 may be formed and encapsulated to complete the organic EL display device.

Each organic material layer constituting the organic layer may be formed of a typical organic material, whether it is small-molecule or polymer. However, when an organic material layer is formed of a polymer, the polymer has a lower surface roughness than the small-molecule, so that the polymer surface may be treated to make it rougher.

Further, the organic emission layer 150 may be formed of fluorescent materials, phosphorescent materials, or other like materials.

While only the hole injection layer 130 and the hole transport layer 140 have been described above, any organic material layer may be surface treated.

When the first electrode 110 is a cathode electrode, the order of deposition described above is reversed, and the second electrode 190 becomes an anode electrode.

An example of the present invention and a comparative example will now be described. The example is illustrative only, and it should not be construed to restrict exemplary embodiments of the present invention.

EXAMPLE 1 AND COMPARATIVE EXAMPLE 1

A test substrate was fabricated for a bottom emission organic EL device.

ITO was patterned on the substrate as an anode, and a pixel defining layer (PDL) was further formed to block the ITO edge, so that the pixel region was defined. The substrate on which the ITO and PDL were formed was cleansed, and was then UV-$O_3$ treated for 15 minutes, and a polyfluorene-arylamine-based polymer solution, for a hole injection layer, was coated on the cleansed substrate to a thickness of 25 nm at a suitable spin speed. Next, the hole injection layer of the cathode contact portion was removed and dried for 10 minutes at 200° C.

Figure 3A:
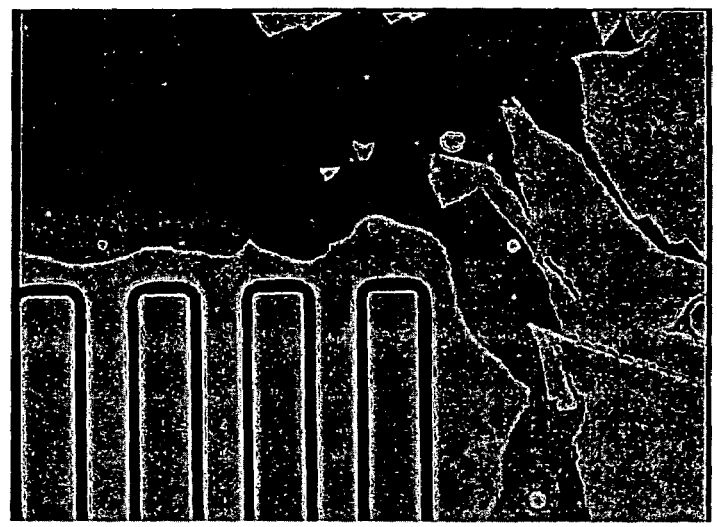
FIG. 3A is a photograph showing a laminated surface where surface treatment in accordance with an exemplary embodiment of the present invention is not performed before laminating a donor film on a substrate.
Figure 3B:
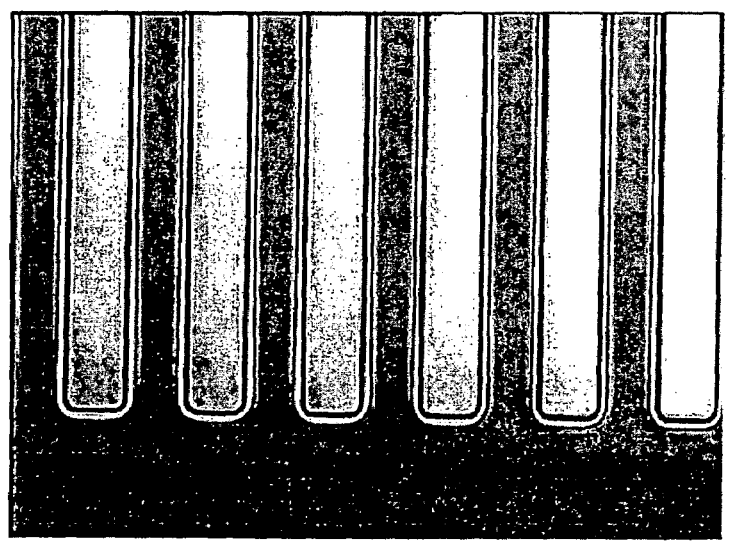
FIG. 3B is a photograph showing a laminated surface where surface treatment in accordance with an exemplary embodiment of the present invention is performed before laminating a donor film.

Separately, a donor film having a photo-thermal conversion layer was divided into a film that was oxygen plasma treated for 10 minutes (Example 1) and a film that was not oxygen plasma treated (Comparative example 1). The treated and untreated film portions were put into a depositor to deposit CBP/Ir(PPy)3 to a thickness of about 300 Å, and was then laser-transferred. The laser transfer included laminating the donor film on the substrate, and FIG. 3A and FIG. 3B show the results. As shown in FIG. 3A of the Comparative example 1 and FIG. 3B of the Example 1, when the surface-treated donor film was laminated, a small-molecule material was not removed from the PDL portion, as shown in FIG. 3B. Here, the surface roughness of the donor film was 35 Å (Rms).

After transferring the emission layer as described above, the substrate was put into the depositor, and the remaining materials were deposited.

Identically, when the adhesion toward the substrate of the material to be transferred is poor, the plasma treatment may be performed toward the substrate that was coated by the hole injection layer.

According to exemplary embodiments of the present invention as described above, increasing the surface roughness of at least one of the organic layers increases the adhesion between the organic layers included in the organic EL display device, thus facilitating the formation of the organic layer, and preventing the layer damage or the particle generation occurring by the adhesion failure between the organic layers in the subsequent process, so that the failure rate may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent (EL) display device, comprising:
    a substrate;
    a first electrode formed on the substrate;
    an organic layer formed on the first electrode; and
    a second electrode formed on the organic layer,
    wherein the organic layer comprises a first layer and a second layer, the second layer comprising two polymer layers;
    wherein each polymer layer has a treated surface with a roughness in a range of Root mean square (Rms) 11 Å to 50 Å, and the treated surfaces of the two polymer layers contact each other.

2. The organic EL display device of claim 1, wherein the first layer is an organic emission layer.

3. The organic EL display device of claim 1, wherein one of the two polymer layers is a hole injection layer, a hole transport layer, a hole blocking layer, an electron transport layer or an electron injection layer.

4. The organic EL display device of claim 1, wherein the two polymer layers are a hole injection layer and a hole transport layer.

5. The organic EL display device of claim 3, wherein the first electrode is an anode and the second electrode is a cathode.

6. The organic EL display device of claim 1, wherein the first electrode is a cathode and the second electrode is an anode.

7. The organic EL display device of claim 1, further comprising a thin film transistor.

8. The organic EL display device of claim 1, wherein an upper layer of the two polymer layers is formed by a laser induced thermal imaging (LITI) method.

* * * * *